(12) United States Patent
Hangal et al.

(10) Patent No.: US 7,689,399 B1
(45) Date of Patent: Mar. 30, 2010

(54) AUTOMATIC EXTRACTION OF DESIGN PROPERTIES

(75) Inventors: Sudheendra G. Hangal, Bangalore (IN); Naveen Chandra, Bangalore (IN)

(73) Assignee: Sun Microsystems, Inc., Santa Clara, CA (US)

( * ) Notice: Subject to any disclaimer, the term of this patent is extended or adjusted under 35 U.S.C. 154(b) by 621 days.

(21) Appl. No.: 10/931,727

(22) Filed: Aug. 31, 2004

(51) Int. Cl.
*G06F 17/50* (2006.01)

(52) U.S. Cl. .................. 703/14; 716/4; 716/5

(58) Field of Classification Search .......... 703/13, 703/14; 716/4, 5
See application file for complete search history.

(56) References Cited

U.S. PATENT DOCUMENTS

| 6,539,523 | B1* | 3/2003 | Narain et al. ............... 716/5 |
| 6,745,160 | B1* | 6/2004 | Ashar et al. ................. 703/14 |
| 6,848,088 | B1* | 1/2005 | Levitt et al. ................. 716/4 |
| 7,028,279 | B2* | 4/2006 | Jain et al. ................... 716/5 |
| 7,065,726 | B1* | 6/2006 | Singhal et al. ............... 716/5 |
| 7,159,198 | B1* | 1/2007 | Ip et al. ...................... 716/5 |
| 7,454,324 | B1* | 11/2008 | Seawright et al. ........... 703/14 |
| 2002/0038203 | A1* | 3/2002 | Tsuchiya ..................... 703/15 |
| 2003/0110474 | A1* | 6/2003 | Ur et al. ..................... 717/131 |
| 2003/0125920 | A1* | 7/2003 | Matsuoka et al. ............ 703/15 |
| 2004/0148150 | A1* | 7/2004 | Ashar et al. ................. 703/14 |
| 2005/0193280 | A1* | 9/2005 | Schubert et al. ............. 714/47 |

OTHER PUBLICATIONS

Sergey Berezin, Model Checking and Theorem Proving a Unified Framework, 2002.*

* cited by examiner

*Primary Examiner*—Paul L Rodriguez
*Assistant Examiner*—Andre Pierre Louis
(74) *Attorney, Agent, or Firm*—Martine Penilla & Gencarella LLP.

(57) ABSTRACT

A method for automatic extraction of design properties of a hardware design, is provided. The method includes running a hardware design simulation to generate simulation results for the hardware design. The simulation results are then analyzed to extract properties. The extracted properties can be a powerful tool for the design engineers and the test-writers to learn more about the functional coverage of the test suites.

20 Claims, 7 Drawing Sheets

IODINE

File  Options  Help

Modules List
- ☑ All
- ☐ <DESIGN>
- ☐ ch_sys.ch_mod0.ch_cpu.emu.ecu
- ☐ ch_sys.ch_mod0.ch_cpu.emu.ecu.ecaddr_ctl  ─ 604

InvariantsList ─ 602
- ☐ ConstantsInvariant
- ☐ OneHotInvariant
- ☐ DelayInvariant
- ☑ ReqAckInvariant
- ☐ StateInvariant ─ 606

─ 610

Results

| Invariants | Type | Rank | Required |
|---|---|---|---|
| // Oin score-max_ids 1-tx 1'b1 -rx_id1'b1-rx<br>cn_sys.ch_mod0.ch_cpu.emu.ecu.final_sel_bypass_n-tx<br>cn_sys.ch_mod0.ch_cpu.emu.ec_it_cs-max_count_per_id 1-min 0<br>-max 1 | ReqAckInvariant | 42 | ☐ |
| // Oin score-max_ids 1-tx 1'b1 -rx_id1'b1-rx<br>cn_sys.ch_mod0.ch_cpu.emu.ecaddr_ctl.block_memory_updates_n-tx<br>cn_sys.ch_mod0.ch_cpu.emu.ecu.sel_bp_jbu_data_err-max_count_per_id<br>3-min 5-max7 | ReqAckInvariant | 24 | ☐ |
| // Oin score-max_ids 1-tx 1'b1 -rx_id1'b1-rx<br>cn_sys.ch_mod0.ch_cpu.emu.ecu.mc_asi_wr_out-tx<br>cn_sys.ch_mod0.ch_cpu.emu.ec_west_asi_wr_in-max_count_per_id 1<br>-min 10 - max 16 | ReqAckInvariant | 20 | ☐ |
| // Oin score-max_ids 1-tx 1'b1 -rx_id1'b1-rx<br>cn_sys.ch_mod0.ch_cpu.emu.ecu.mc_asi_wr_out_id-tx<br>cn_sys.ch_mod0.ch_cpu.emu.ec_west_asi_wr_in-max_count_per_id 1<br>-min 9 - max 15 | ReqAckInvariant | 20 | ☐ |
| // Oin score-max_ids 1-tx 1'b1 -rx_id1'b1-rx<br>cn_sys.ch_mod0.ch_cpu.emu.ecu.mc_asi_wr_out_id-tx<br>cn_sys.ch_mod0.ch_cpu.emu.ecu.ecaddr_ctl_ec_asi_wr_out | ReqAckInvariant | 20 | ☐ |

─ 608

Checked Invariants    Invariants Bag    Signal Filter    Stats
[Delete] [Add to Bag]    [View Bag] [Save Bag]    Reject Signal / Select Signal    Total Invariants: 896 / Currently Viewing: 46 / Invariants in Bag: 0    ☐ Check All

FIG. 6

AUTOMATIC EXTRACTION OF DESIGN PROPERTIES

BACKGROUND OF THE INVENTION

1. Field of the Invention

The present invention relates generally to hardware design verification, and in particular to verification of the design by extracting properties about the hardware design by analyzing the simulation data.

2. Description of the Related Art

The hardware designs of today are extremely complex and often include millions of transistors. One of the challenges with these extremely complex hardware designs is ensuring that the electrical circuits included in these hardware designs function as intended. Therefore, designers often use verification methods to confirm whether the design behavior conforms to the design purpose.

Traditional verification methods include simulation of the design. During simulation, millions of cycles of simulations are run for different sets of simulation vectors in order to determine whether the output would be as expected. However, verification methodology based on simulation is proving to be ineffective in finding deep corner-case design faults. Often, such design faults are found only after products implementing the design have been manufactured. This can lead to defective products, which in turn can result in millions of dollars in lost revenue.

Property checking (also sometimes referred to as model checking or formal verification) (PC) is another method another method used to test the circuit functionality. Generally in PC, a block of the design is taken at a time and it is determined whether for all possible inputs, a critical property is true. PC can be effective in finding corner-case design faults by exploring the design behavior on all possible input sequences. One of the obstacles with this approach is that the designer is required to specify a list of properties about the design to be proven through the PC method. The process is tedious and error prone. It is more than likely that the list of properties is not exhaustive and the likelihood of missing some of the required properties is high.

To solve this problem, there have been prior attempts to infer properties, either automatically, or based on directives already present in the design's source code. But, these properties have been based on either annotations already present in the design or properties, which are universal in designs. Examples of design properties which are universal are: a declared variable or net should not be constant, an array offset, should be within a declared range of the array, all states in a state machine should be reachable etc. Other previous efforts to ease the burden of writing properties include pre-packaged property annotations on library elements, thereby removing the need to specify particular properties everywhere that the library element is instantiated. Again, this requires manual property annotation for the library elements, along with the need to follow specific design/coding styles, and thus restricting the verification method to a simple class of checks such as "multiplexer select lines for a particular class of multiplexers should be one-hot".

In view of the foregoing there is a need for a hardware design verification method that is effective in finding corner-case faults and also in inferring properties automatically.

SUMMARY OF THE INVENTION

Broadly speaking, the present invention fills these needs by providing a system and method for verifying hardware design functionality. The verification is conducted by extracting properties of a hardware design from the results of simulation runs performed. The extracted properties may be exploited by the design engineers and the test-writers to uncover hardware design problems that might exist in a design.

It should be appreciated that the present invention can be implemented in numerous ways, including as a process, an apparatus, a system, a device, or a method. Several inventive embodiments of the present invention are described below.

In one embodiment, a method for automatic extraction of design properties of a hardware design is provided. The method initiates with running a hardware design simulation yielding simulation results. The method then proceeds to analyzing the simulation results produced by the hardware design simulation. Properties are extracted by the analyzing of the simulation results. The extracted properties may be used by the design engineers for various purposes as they seem fit.

In another embodiment, a system for automatic extraction of design properties of a hardware design is provided. The system includes a simulator for running hardware design simulation of the hardware design. The system further includes an analyzer for analyzing the simulation results to generate properties. The analyzing of the simulation results to generate properties automatically, which may be potentially obeyed by the hardware design. The analyzing unit includes a plurality of analyzers wherein, each analyzer is used to analyze a particular functionality of the hardware design.

In another embodiment, a system for automatic extraction of design properties of a hardware design is provided. The system includes means for running hardware design simulation. The system further includes means for analyzing simulation results to generate properties.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 6 shows an exemplary GUI screen, which may be viewed by a design engineer in accordance with an embodiment of the present invention.

DETAILED DESCRIPTION

Several exemplary embodiments of the invention will now be described in detail with reference to the accompanying drawings.

The present invention provides, among other things, a system and a method for hardware design verification by extracting properties about the hardware design by analyzing simulation data. The verification is conducted by automatically generating an exhaustive list of properties from hardware design simulation results.

Figure 1:
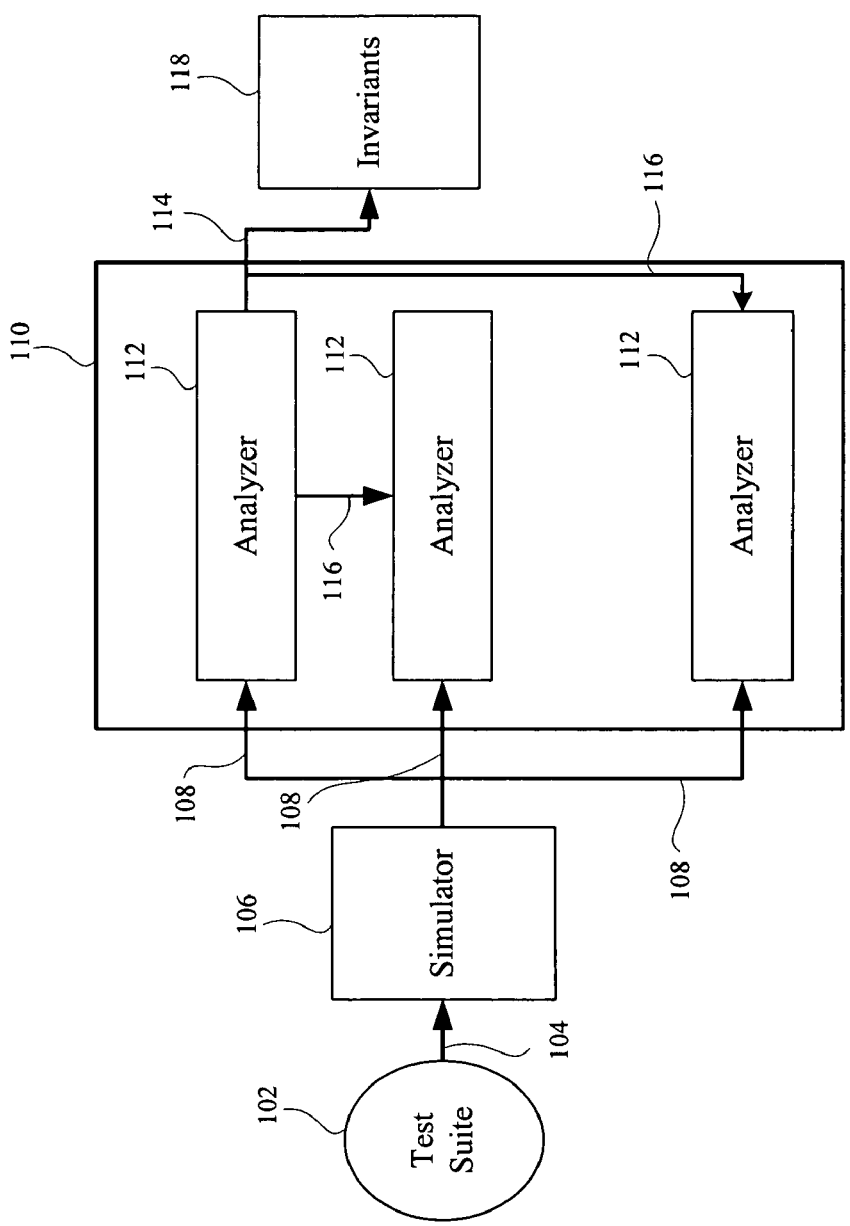
FIG. 1 shows a system for generating properties from simulation data in accordance with an embodiment of the invention.

FIG. 1 shows a system for generating properties from simulation data in accordance with an embodiment of the invention. The system comprises of a simulator 106 that receives test suites 102 for the hardware design that is being tested for design functional accuracy. The test results are sent to an analyzing unit 110. The analyzing unit 110 contains a plurality of analyzers 112. The analyzers 112 generate invariants 118, also called properties, by analyzing the data from the simulator. The analyzers are capable of receiving data from the simulator and also receive data from other analyzers as shown by arrow 116.

Each of the analyzers 112 in the analyzing unit 110 is configured to analyze a particular functionality of the hardware design. For example, one of the analyzers may be designed to analyze a request/acknowledge function of a bus in a hardware design, as a bus request is always followed by bus acknowledge within a few clock cycles. Similarly, a load request is always followed by a tag look up. Another analyzer might include a FIFO analyzer, which may be used to analyze the number of entries, enque/deque enables, and enque/deque data. A state machine analyzer may be used to analyze transitions of a state machine from one state to the next for example, a counter where the counter can only count up or down. There may also be other analyzers such as one-hot analyzer to analyze properties of a vector where at most or exactly one bit of the vector is required to be either one or zero. Other analyzers include equal analyzer, for extracting dynamic aliases, constant analyzer for extracting constant signals.

Figure 2:
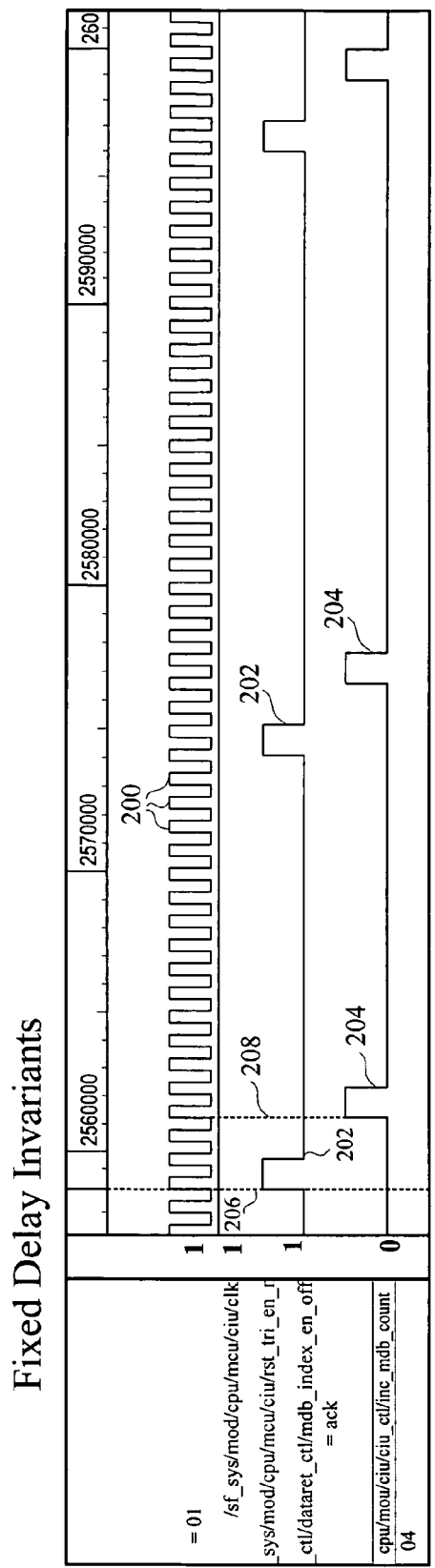
FIG. 2 shows an example of an output of request/acknowledge invariant represented graphically in accordance with an embodiment of the invention.

FIG. 2 shows an example of an output of request/acknowledge invariant 118 represented graphically in accordance with an embodiment of the invention. This Figure illustrates fixed delay invariants wherein a request 202 is followed by an acknowledge 204 exactly after three cycles. The first line 200 shows the rising and falling edges of a clock cycle. In this graph, the request 202 takes place at a rising edge of the clock cycle as indicated by the dotted line 206 and the acknowledge takes place at a rising edge of the clock cycle exactly after three cycles as indicated by the dotted line 208.

The list of analyzers described above is an exemplary one, and is by no means an exhaustive list. Furthermore, the list provided above may be extended according to the design or coding styles. For example, if the design involves a digital signal processing (DSP) circuit, then the analyzers can be enhanced to seek out properties that are usually relevant for the DSP domain.

Figure 3:
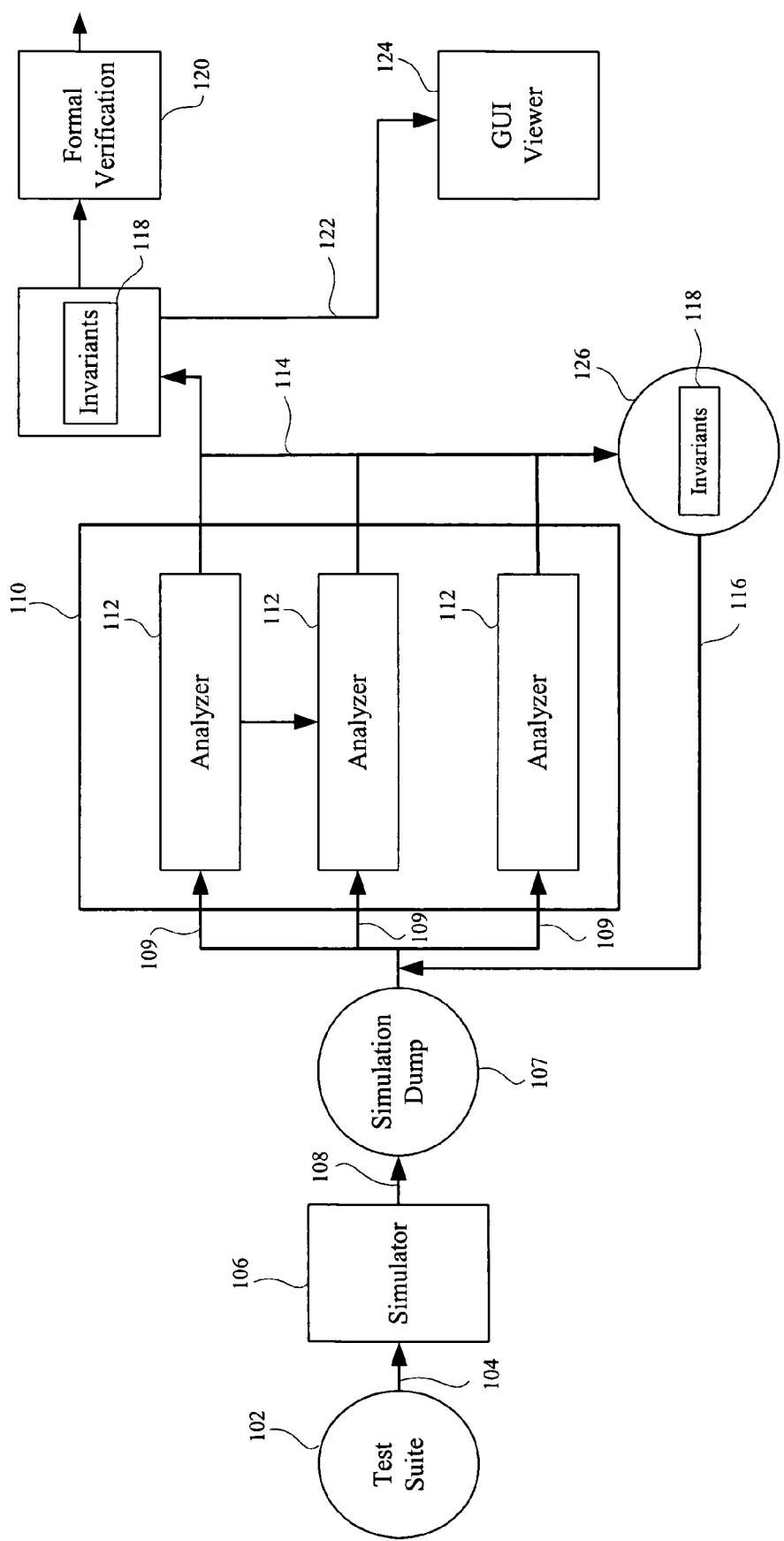
FIG. 3 shows a system that analyzes simulation dumps to generate properties in accordance with an embodiment of the invention.

FIG. 3 shows a system for generating properties by analyzing simulation dumps in accordance with another embodiment of the invention. FIG. 3 is similar to FIG. 1, except that in this embodiment simulation dump 107 is generated, for holding the simulation results. In one embodiment, the simulation dump may be data files. The dumps are fed into analyzers according to the functionality to be analyzed. The simulation dumps can come in many different formats and the system described herein is capable of supporting all the many different formats. The analyzers generate invariants 118 as described above with respect to FIG. 1. The invariants 118 that are generated are used for property checking 120. As can be seen, the present invention relieves the design engineer from defining the invariants by providing an exhaustive list of invariants for property checking automatically. In one embodiment, the invariants generated are stored in a database 126. FIG. 3 is further shown to include a feedback 116 through which the invariants stored in the database may be fed back, so that other analyzers may reuse some or all of the invariants generated earlier. The initial analysis done by some of the analyzers may be used as a preprocessing step for other analyzers. FIG. 3 further includes a graphical user interface (GUI) viewer 124, where a design engineer may be able to view the result of the analysis by the analyzers 112. The GUI viewer 124, may be further used by the design engineers as an input/output device wherein the design engineer may make selections of the properties to be used for property checking.

Figure 4:
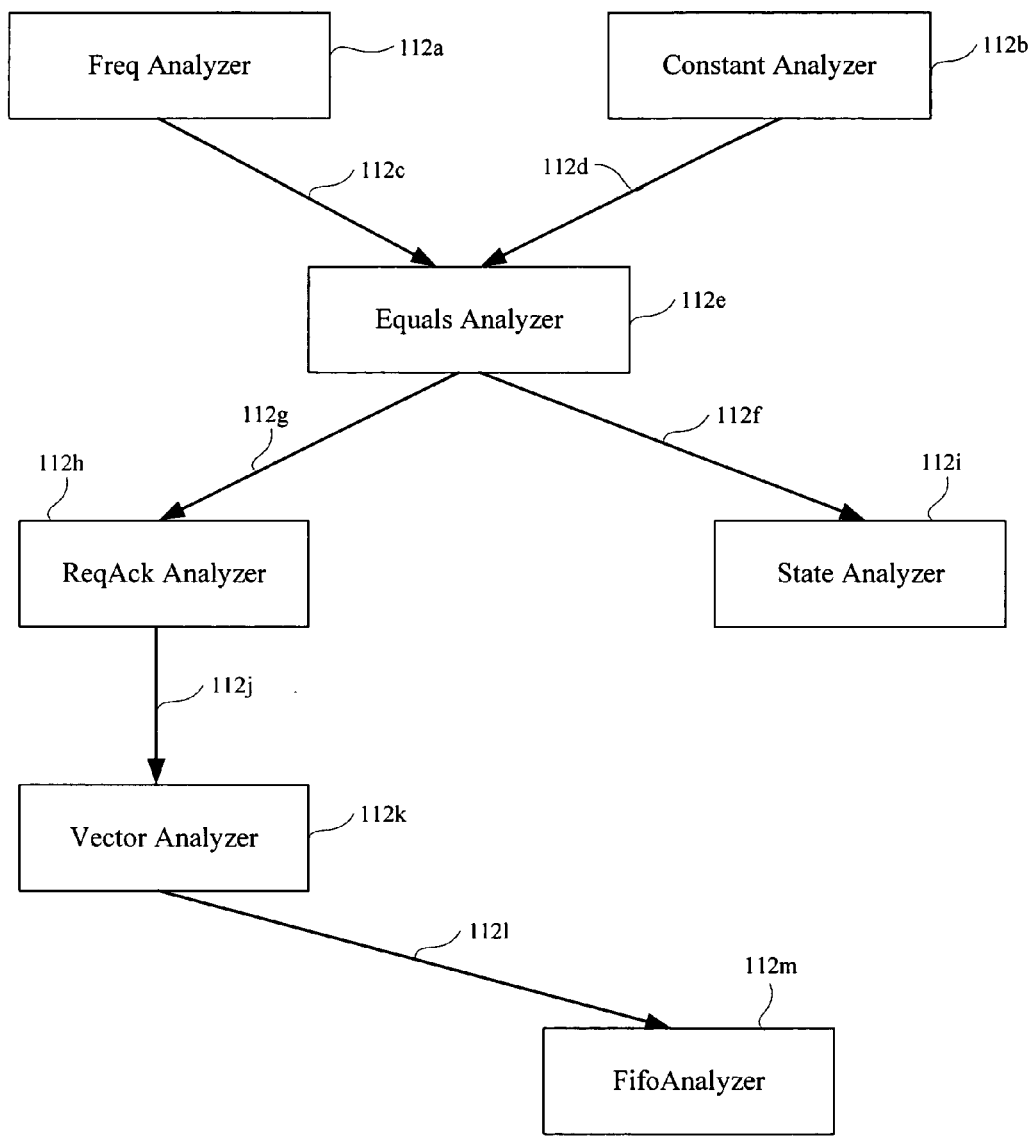
FIG. 4 illustrates analyzer dependencies wherein the first analyzer functions as a preprocessor to a second analyzer in accordance with an embodiment of the invention.

FIG. 4 illustrates analyzer dependencies wherein the analysis of the data by a first analyzer functions as a preprocessing step for a second analyzer. In FIG. 4, the freq analyzer, 112a extracts candidate request/acknowledge (req/ack) pairs for the req/ack analyzer. As such, the data from frequency analyzer 112a is passed down to req/ack analyzer 112h through equals analyzer 112e as indicated by arrows 112c and 112g. The equals analyzer 112e also receives data from constant analyzer 112b. The equals analyzer 112e extracts dynamic aliases and the constant analyzer 112b extracts constant signals. The equals analyzer sends data to the state analyzer 112i and the req/ack analyzer 112h as indicated by arrows 112f and 112g. As described above, state analyzer may be used to analyze transitions of a state from one state to the next and the req/ack analyzer may be designed to analyze request/acknowledge function of a bus in a hardware design. The req/ack analyzer sends data to vector analyzer 112k as shown by arrow 112j. The vector analyzer 112k extracts candidate vectors for the FIFO analyzer 112m as indicated by arrow 112l.

Figure 5:
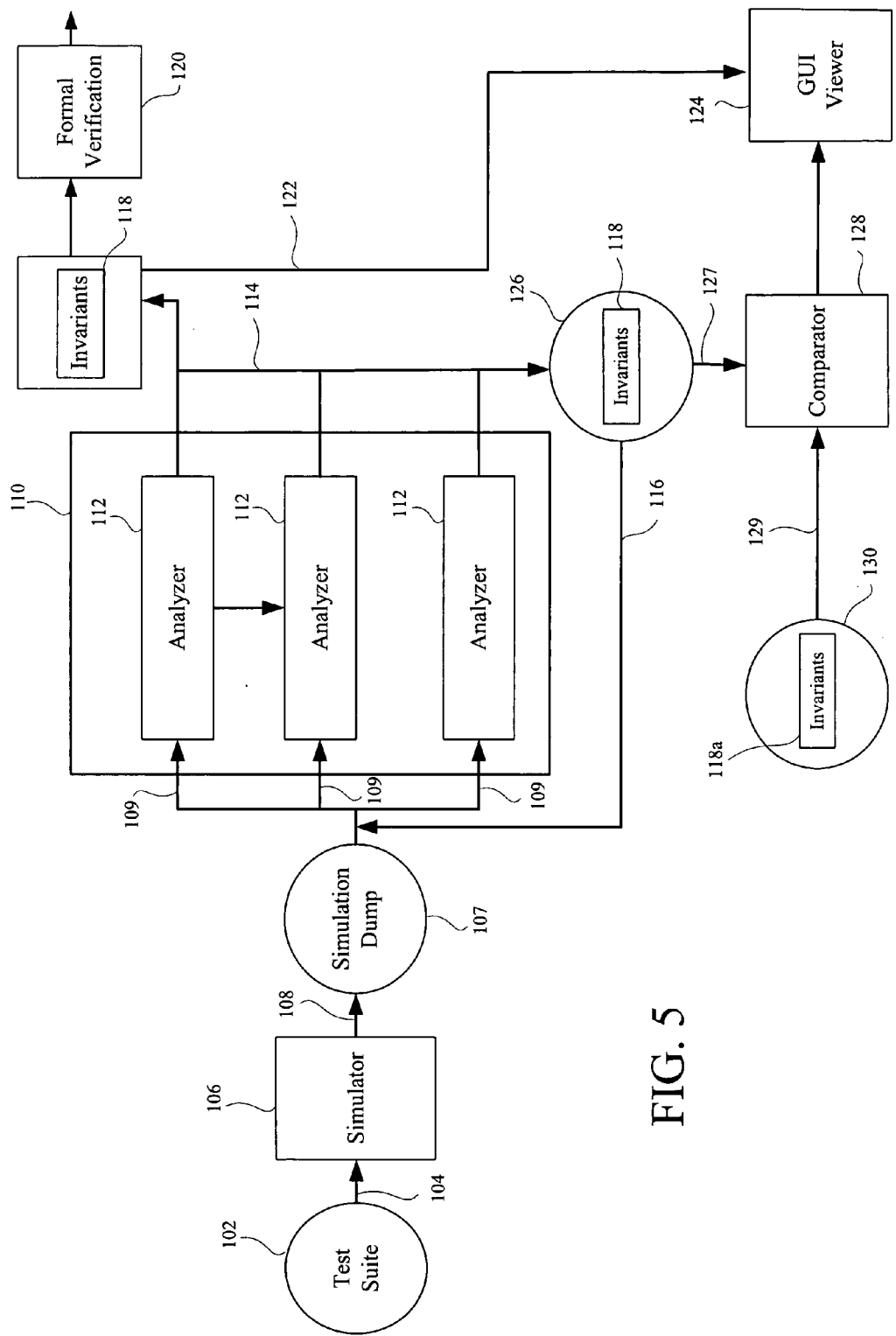
FIG. 5 shows a system for generating properties that includes a comparator in accordance with another embodiment of the invention.

FIG. 5 shows a system for generating properties that includes a comparator in accordance with another embodiment of the invention. FIG. 5 is similar to FIGS. 1 and 3. In FIG. 5, the system includes comparator 128. The comparator 128 may be used to compare design changes. For instance, in the normal process of design evolution, as the design is changed, the designers may find it useful to compare invariants before and after design changes to know if the design changes may cause any unexpected impact on design behavior. The comparator 128 in FIG. 5 may be used to compare the invariants prior to and subsequent to design changes. The invariants 118a are invariants generated from analysis of different design version may be stored in a database 130 and the current invariants 118 that are generated after the design change are stored in database 126. Both the invariants 118 and 118a are input to the comparator 128. The comparator 128 compares the two invariants 118 and 118a. The difference between the two invariants 118 and 118a may be viewed by the design engineer through the GUI viewer 124. The design engineer can obtain valuable information about the hardware design behavior, by observing the differences in the invariants. The system described above, is further configured to assign a confidence value to each of the invariants generated. The confidence value is a measure of how certain the analysis system is that the property is a valid property of the design, and not merely an accidental observation. For example, if an event sequence has been observed to be true over a million occurrences, then that event sequence is assigned a higher confidence value than an event sequence, which has occurred maybe ten times because the likelihood of the former sequence being a valid property is very high.

FIG. 6 shows an exemplary GUI screen which may be viewed by a design engineer in accordance with an embodiment of the present invention. The engineer may select the invariant type that the designer is interested from the invariant list. In this case, the designer chose ReqAckinvariant as indicated by the check mark in the invariant list. The results show the different properties 604, type of property 606, rank 608 and selection panel 610. The type of property 606 depends on the choice made by the designer from invariants list 602. The design engineer may also select other types of invariants, such as a state invariant, to view the transitions of a state machine from one state to the next. The selections in the invariant list 602 also show oneHotinvariant. As described above, one-hot invariant is a property of a vector signal where exactly or at most one bit of the vector can be zero or one. Other invariants in the invariant list include Constant invariant that extracts constant signals and Delay invariant which identifies pairs of signals related by a fixed delay between them. The rank 608 shows the confidence associated with the invariant, which can be based on the number of times a particular sequence occurred. Also, based on the confidence, the design engineer might make a decision as to whether a particular invariant is required or not required by checking the appropriate boxes in the selection panel 610.

One of the other embodiments includes a system for automatic extraction of design properties of a hardware design. The system includes means for running hardware design simulation. The hardware simulation may be conducted using emulation machines or real hardware. The system further includes means for analyzing simulation results to extract properties.

Figure 7:
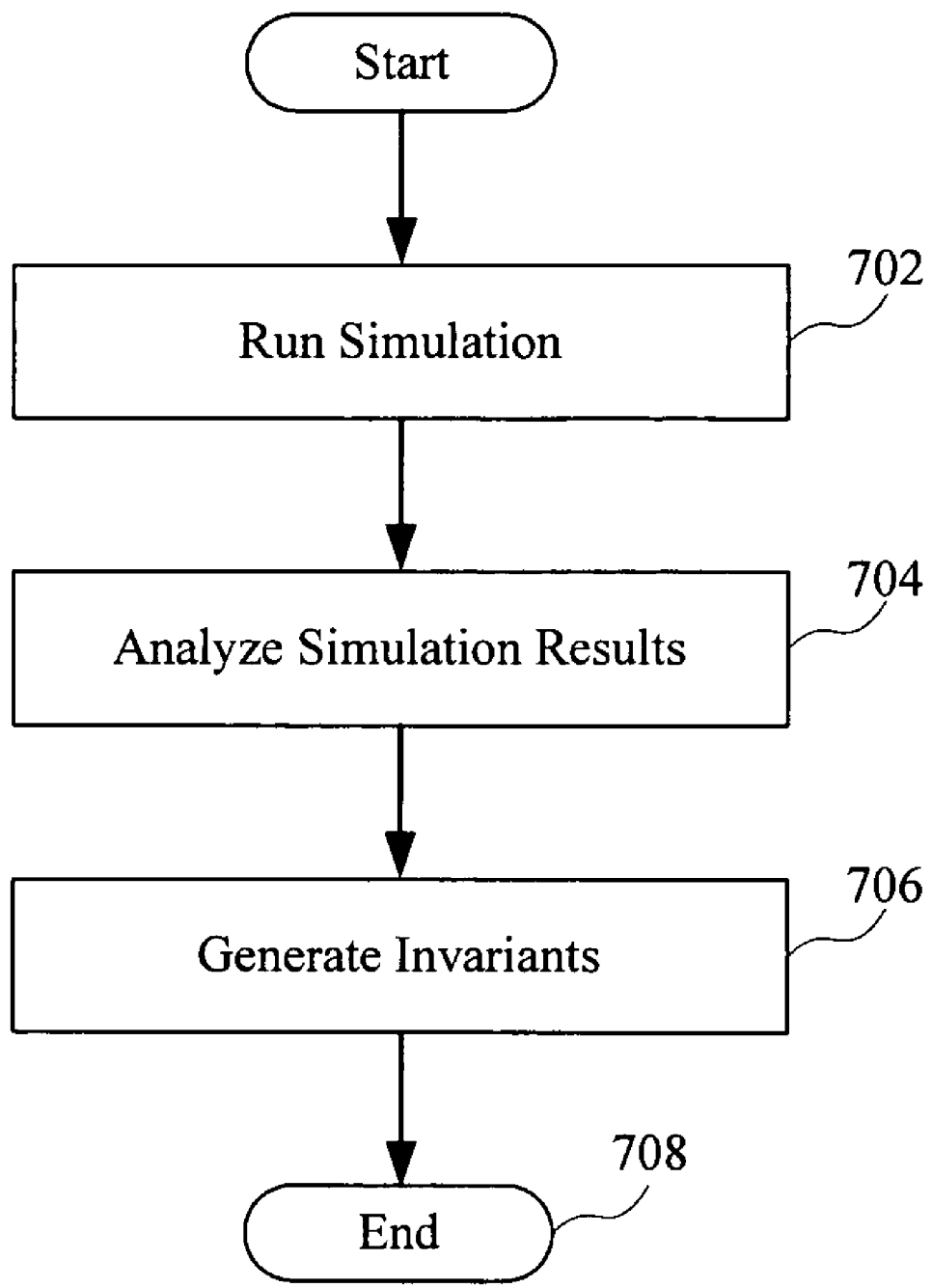
FIG. 7 is a flowchart illustrating the method of operations for generating invariants from the results of simulation runs in accordance with an embodiment of the invention.

FIG. 7 is a flowchart illustrating the method of operations for generating invariants from the results of simulation runs in accordance with an embodiment of the invention. The method is initiated by having a simulation run in operation 702. The results of the simulation run are then forwarded to analyzers in operation 704. As described above, each analyzer is devised to analyze a particular functionality of the hardware design. The results from one analyzer may be an input to another analyzer so that the results of the analysis of the simulation results by a first analyzer functions as a preprocessing step for a second analyzer. Continuing with FIG. 7, the analyzers then generate invariants in operation 706. The invariants thus generated, have various uses. For example, the invariants may be used as input to property checking method described above.

In sum, an embodiment of the invention observes the behavior of the hardware design for test suites used in simulation and extracts invariants from the behavior observed. The extracted invariants can be exploited by the design engineers in several ways. First of all, the method can provide an automatic and thorough analysis of all the specified parts of a hardware design by extracting all "probable" properties of the specified type such as a FIFO queue, state transitions, one-hot vectors etc., some of which were described in detail above. The design engineers can use the extracted properties to resolve design problems or, can be directly checked exhaustively using PC methodology. Moreover, the confidence value associated with each invariant, can be used by the design engineer to prioritize the order of the properties according to importance.

Additionally, if the invariants generated are found to be invalid, this can assist the design engineer to identify a coverage deficiency in the test suite. This is a useful feed back to engineers who write the test suites. The method can also provide higher functional coverage deficiencies. For instance, if the design engineer knows that a FIFO queue in the design is capable of queuing eight entries, but FIFO extracted automatically by the present method infers only a four entry in the FIFO queue, which shows that the test suite failed to assess the condition where the FIFO queue became full. Such functional coverage information can be useful to test-writers.

Furthermore, an embodiment of the invention provides ways to compare design changes. Often, late-stage design changes are tested inadequately due to lack of time. The comparator described above, can compare the properties generated from the two versions of the design, i.e. one before the design change and one after the design change for the same test suite. The difference in the properties help to provide valuable information to design engineers as to how a change made to the hardware design, affected the behavior of the hardware design.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for automatic extraction of design properties of a hardware design, comprising:
    running hardware design simulation to generate simulation results for the hardware design;
    transferring the simulation results to a plurality of analyzers, each of the plurality of analyzers being configured to analyze a particular hardware functionality of the design;
    generating a plurality of properties, the plurality of properties being generated by each of the plurality of analyzers, the plurality of analyzers further configurable to generate specific properties according to a corresponding specific hardware functional aspect of the design, wherein each of the plurality of properties are in a format that can be used for automatic property checking;
    extracting properties produced by the analyzing of the simulation results;
    assigning a confidence value indicating validity of the extracted properties, the confidence value based on a number of times a particular event sequence is observed; and
    prioritizing the extracted properties according to the associated confidence values.

2. The method of claim 1, further comprising:
   passing the extracted properties to a verification tool.

3. The method of claim 1 wherein sequentially analyzing further includes transmitting said analytical result for said one of said analytical operations to two differing subsequent analytical operations in said sequence to be operated on thereby.

4. The method of claim 1 wherein sequentially analyzing the simulation results further includes receiving a pair of analytical results from two different analytical operations in said sequence.

5. The method of claim 1, further comprising:
   selecting the properties as required based on the confidence value.

6. The method of claim 4, further comprising:
   reusing the properties stored in the database for further analysis.

7. The method of claim 1, further comprising:
   generating a simulation dump using the simulation results.

8. The method of claim 1, wherein the properties being obtained directly from the simulation results without manual definition.

9. The method of claim 8, wherein the properties defining performance of the hardware design.

10. A system for automatic extraction of design properties of a hardware design, comprising:
    simulator for running hardware design simulation of the hardware design and produce simulation results;
    an analyzing unit to receive and analyze said simulation results, the analyzing unit being configured to produce a plurality of properties in response thereto corresponding to said hardware design, the analyzing unit includes a plurality of analyzers, each of the plurality of analyzers being configured to analyze a particular hardware functionality of the design, wherein the plurality of analyzers being further configurable to include enhancements to seek out specific properties relevant to a corresponding specific hardware functional aspect of the design, and each of the plurality of properties are in a format that can be used for automatic property checking;
    a database in data communication with said analyzing unit to receive and store said properties; and
    a comparator in data communication with both said database and said analyzing unit, with said comparator configured to receive a first set of properties from said analyzing unit and a second set of properties from said database, said comparator being configured to determine differences among said first and second sets of properties.

11. The system of claim 10, wherein the analyzing unit includes a plurality of analyzers coupled to sequentially perform multiple analytical functions, the analyzing unit is further configured to assign a confidence value each property based on a number of times a particular event sequence is observed and prioritizes the properties according to the associated confidence values.

12. The system of claim 10, further comprising: a property checking unit for receiving the properties.

13. The system of claim 12, wherein the database is configured to be accessible by the plurality of analyzers.

14. The system of claim 10, further comprising: a graphical user interface (GUI) for a user to view the properties generated.

15. A computer readable media including program instructions for automatic extraction of design properties of a hardware design, comprising:
    program instructions for running hardware design simulation;
    program instructions for transferring the simulation results to a plurality of analyzers, each of the plurality of analyzers being configured to analyze a particular hardware functionality of the design;
    program instructions for generating a plurality of properties, the plurality of properties being generated by each of the plurality of analyzers, the plurality of analyzers further configurable to include enhancements to seek out specific properties relevant to a corresponding to specific hardware functional aspect of the design, wherein each of the plurality of properties are in a format that can be used for automatic property checking;
    program instructions for extracting properties produced by the analyzing of the simulation results; and
    program instructions for assigning a confidence value indicating validity of the properties, the confidence value based on a number of times a particular event sequence is observed.

16. The computer readable media of claim 15, further comprising:
    program instructions for storing the properties.

17. The computer readable media of claim 15, further comprising:
    program instructions for verifying the properties.

18. The computer readable media of claim 15, further comprising:
    program instructions for comparing the properties from different simulation runs.

19. The computer readable media of claim 15, further comprising:
    program instructions for prioritizing the properties according to the associated confidence values.

20. The computer readable media of claim 15, further comprising:
    program instructions for deciding if a particular property is required according to the associated confidence values.

* * * * *